(12) United States Patent
Hatakeyama

(10) Patent No.: US 11,486,758 B2
(45) Date of Patent: Nov. 1, 2022

(54) ULTRASONIC SENSOR

(71) Applicant: Murata Manufacturing Co., Ltd., Nagaokakyo (JP)

(72) Inventor: Hirotoshi Hatakeyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 389 days.

(21) Appl. No.: 16/831,876

(22) Filed: Mar. 27, 2020

(65) Prior Publication Data

US 2020/0225081 A1 Jul. 16, 2020

Related U.S. Application Data

(63) Continuation of application No. PCT/JP2018/036272, filed on Sep. 28, 2018.

(30) Foreign Application Priority Data

Nov. 2, 2017 (JP) .............................. JP2017-212681

(51) Int. Cl.
*G01H 11/08* (2006.01)
*B06B 1/06* (2006.01)
*H01L 41/047* (2006.01)
*H01L 41/053* (2006.01)

(52) U.S. Cl.
CPC .......... *G01H 11/08* (2013.01); *B06B 1/0644* (2013.01); *H01L 41/0475* (2013.01); *H01L 41/0533* (2013.01)

(58) Field of Classification Search
CPC .................................................... G01H 11/08
USPC ......................................................... 73/661
See application file for complete search history.

(56) References Cited

U.S. PATENT DOCUMENTS 6,047,603 A * 4/2000 Ohtera .................. G10K 9/122
310/322
2006/0241474 A1* 10/2006 Kawashima ............. G10K 9/18
600/459

FOREIGN PATENT DOCUMENTS

| JP | 05-146756 A | 6/1993 |
| JP | 07-203584 A | 8/1995 |
| JP | 11-266497 A | 9/1999 |
| JP | 2000-023295 A | 1/2000 |
| JP | 2002-112395 A | 4/2002 |
| JP | 2002-228742 A | 8/2002 |
| JP | 2007-318742 A | 12/2007 |
| JP | 2010-050963 A | 3/2010 |

(Continued)

OTHER PUBLICATIONS

Official Communication issued in International Patent Application No. PCT/JP2018/036272, dated Nov. 27, 2018.

*Primary Examiner* — Joseph Chang
(74) *Attorney, Agent, or Firm* — Keating & Bennett, LLP

(57) ABSTRACT

An ultrasonic sensor includes a casing and a piezoelectric vibrator element. The casing includes a first unit made of a metal and a second unit made of a resin. The first unit has a cylindrical or substantially cylindrical shape extending in a first direction. The second unit is connected to one end of the first unit in the first direction and includes a cylindrical section and a bottom plate. The cylindrical section extends in the first direction. The bottom plate is a disk-shaped portion which closes an end of the cylindrical section positioned farther away from the first unit in the first direction. The piezoelectric vibrator element is mounted on the bottom plate.

18 Claims, 9 Drawing Sheets

(56) References Cited

FOREIGN PATENT DOCUMENTS

| JP | 2014-110459 A | 6/2014 |
| JP | 2014-204387 A | 10/2014 |
| JP | 2014-230109 A | 12/2014 |

* cited by examiner

ULTRASONIC SENSOR

CROSS REFERENCE TO RELATED APPLICATIONS

This application claims the benefit of priority to Japanese Patent Application No. 2017-212681 filed on Nov. 2, 2017 and is a Continuation Application of PCT Application No. PCT/JP2018/036272 filed on Sep. 28, 2018. The entire contents of each application are hereby incorporated herein by reference.

BACKGROUND OF THE INVENTION

1. Field of the Invention

The present invention relates to an ultrasonic sensor.

2. DESCRIPTION OF THE RELATED ART

An ultrasonic sensor including a casing formed in a cylindrical shape with a closed bottom is disclosed in Japanese Unexamined Patent Application Publication No. H11-266497. The casing is formed as a combination of a cylindrical section and a planar vibrator that are bonded to each other by an adhesive material. In Japanese Unexamined Patent Application Publication No. H11-266497, an insulating material, such as engineering plastics, is used for the cylindrical section, while a conductive member, such as aluminum, is used for the vibrator. An ultrasonic sensor having a similar structure is disclosed in Japanese Unexamined Patent Application Publication No. 2000-23295.

It is desirable that an ultrasonic sensor be able to increase the sound pressure to be higher and the frequency bandwidth to be wider without reducing the resonant frequency. When a vibrator vibrates, a stress is likely to concentrate at the geometric discontinuities between the inner surface of a planar section, which corresponds to a vibrator, and the inner peripheral surface of a cylindrical section. If the planar vibrator made of a metal and the cylindrical section made of a resin are bonded by adhesive, the above-described geometric discontinuities coincide with the bonding joint portion between the metal and the resin. In this manner, if the bonding joint portion is located at the same position as the geometric discontinuities, over the repeated use of the ultrasonic sensor, a breakage may occur in the bonding joint portion due to the stress concentration.

SUMMARY OF THE INVENTION

Preferred embodiments of the present invention provide ultrasonic sensors which are each able to increase the sound pressure to be higher and the frequency bandwidth to be wider without significantly reducing the resonant frequency and also to significantly reduce or prevent the occurrence of a breakage caused by the stress concentration at the geometric discontinuities.

An ultrasonic sensor according to a preferred embodiment of the present invention includes a casing and a piezoelectric vibrator element. The casing includes first and second units. The first unit is made of a metal. The second unit is made of a resin. The first unit has a cylindrical or substantially cylindrical shape extending in a first direction. The second unit is connected to one end of the first unit in the first direction and includes a cylindrical or substantially cylindrical section and a bottom plate. The cylindrical or substantially cylindrical section extends in the first direction. The bottom plate is a disk-shaped portion which closes an end of the cylindrical or substantially cylindrical section positioned farther away from the first unit in the first direction. The piezoelectric vibrator element is mounted on the bottom plate.

According to preferred embodiments of the present invention, it is possible to provide ultrasonic sensors which are each able to increase the sound pressure to be higher and the frequency bandwidth to be wider without significantly reducing the resonant frequency and also to significantly reduce or prevent the occurrence of a breakage caused by the stress concentration at the geometric discontinuities.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
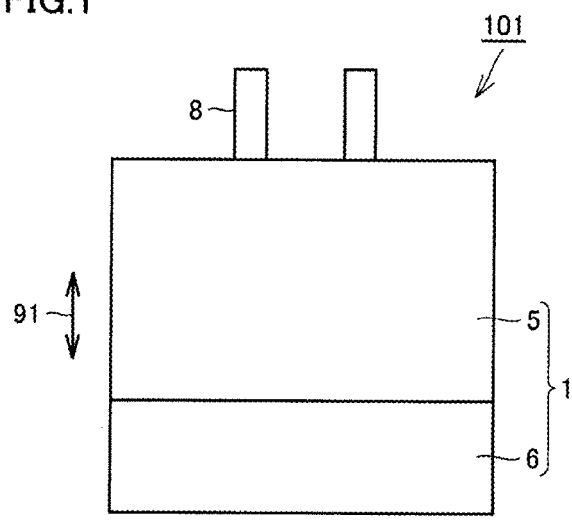
FIG. 1 is a side view of an ultrasonic sensor according to a first preferred embodiment of the present invention.

Preferred embodiments of the present invention will be described in detail with reference to the drawings.

The dimension ratios among the elements in the drawings do not necessarily represent the actual ratios, and may be shown in an exaggerating manner for the sake of representation. In the following description, while referring to the positional concept of "top" or "bottom" ("on" or "under"), it does not necessarily mean the absolute position of "top" or "bottom" ("on" or "under"), and may mean the relative position of "top" or "bottom" ("on" or "under") in the orientations of the elements in the drawings.

First Preferred Embodiment

Figure 2:
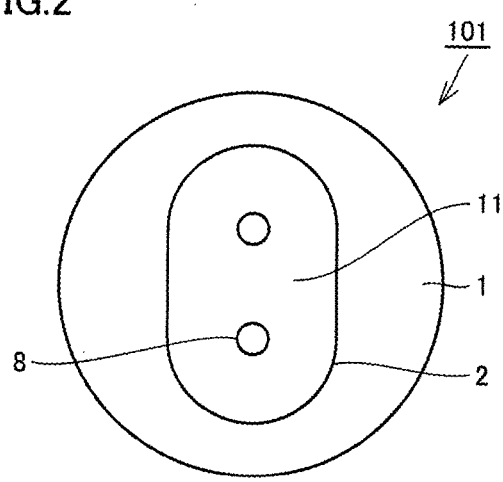
FIG. 2 is a plan view of the ultrasonic sensor according to the first preferred embodiment of the present invention.
Figure 3:
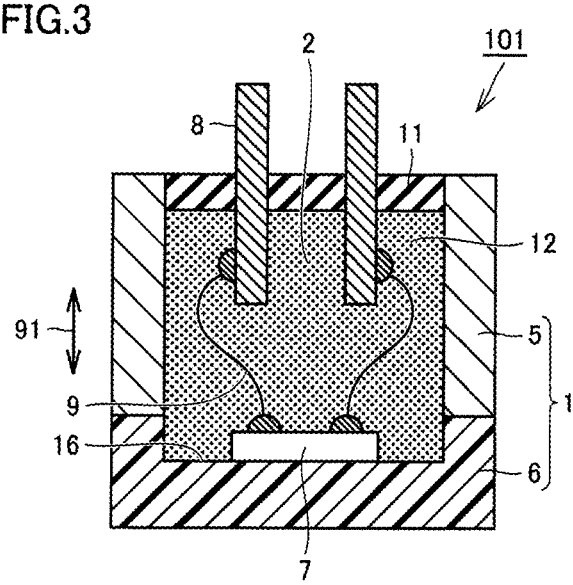
FIG. 3 is a sectional view of the ultrasonic sensor according to the first preferred embodiment of the present invention.
Figure 4:
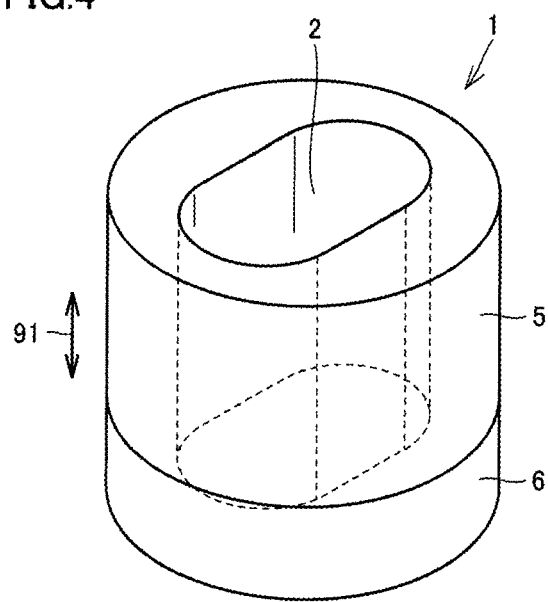
FIG. 4 is a perspective view showing a casing removed from the ultrasonic sensor according to the first preferred embodiment of the present invention.
Figure 5:
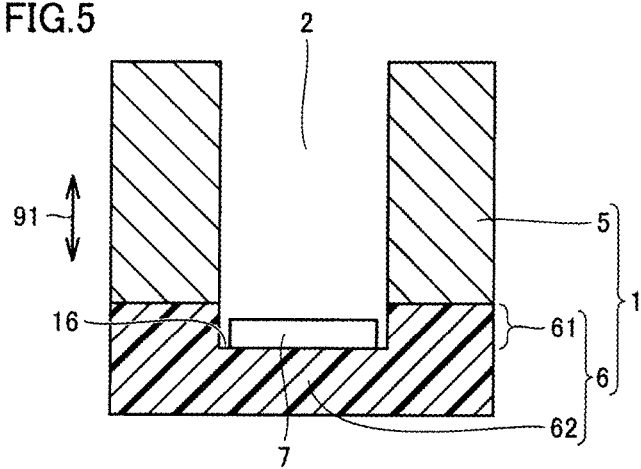
FIG. 5 is a sectional view showing the casing and a piezoelectric vibrator element of the ultrasonic sensor according to the first preferred embodiment of the present invention.

An ultrasonic sensor according to a first preferred embodiment of the present invention will be described below with reference to FIGS. 1 through 5. A side view of an ultrasonic sensor 101 according to the first preferred embodiment is shown in FIG. 1. A plan view of the ultrasonic sensor 101 is shown in FIG. 2. The ultrasonic sensor 101 includes a casing 1 formed in a cylindrical or substantially cylindrical shape with a closed bottom and two terminals 8 protruding from the casing 1. A sectional view of the ultrasonic sensor 101 is shown in FIG. 3. The ultrasonic sensor 101 includes a piezoelectric vibrator element 7. The casing 1 has a hollow portion 2. The casing 1 includes a first unit 5 and a second unit 6. The first unit 5 and the second unit 6 are bonded to each other. The mere casing 1 removed from the ultrasonic sensor 101 is shown in FIG. 4. A sectional view only showing the casing 1 and the piezoelectric vibrator element 7 is shown in FIG. 5.

The first unit 5 is made of a metal and has a cylindrical or substantially cylindrical shape extending in a first direction 91. The second unit 6 is made of a resin and is connected to one end of the first unit 5 in the first direction 91. The second unit 6 preferably includes, for example, a resin having excellent heat resistance and chemical resistance and which also has a high mechanical strength, such as polyethersulfone, polyphenylene sulfide, and polynonamethylene terephthalamide. Accordingly, the casing 1 includes the first unit 5 and the second unit 6 which are made of different materials. The second unit 6 includes a cylindrical section 61 and a bottom plate 62. The cylindrical section 61 is connected to one end of the first unit 5 in the first direction 91 and has in a cylindrical or substantially cylindrical shape extending in the first direction 91. The bottom plate 62 is a disk-shaped portion which closes the end of the cylindrical section 61 positioned farther away from the first unit 5 in the first direction 91. The piezoelectric vibrator element 7 is mounted on the second unit 6, and more specifically, on a surface 16 of the bottom plate 62 positioned closer to the first unit 5.

As shown in FIG. 3, the piezoelectric vibrator element 7 and each of the terminals 8 are electrically connected to each other via wiring 9. A filler 12 fills the inside of the hollow portion 2. The piezoelectric vibrator element 7 and the wiring 9 are sealed by the filler 12. A lid 11 covers the entrance of the hollow portion 2. The filler 12 is covered by the lid 11. The configuration with the lid 11 is only an example. The provision of the lid 11 may be omitted.

In the ultrasonic sensor 101, the geometric discontinuities in the casing 1 are located at a position corresponding to the second unit 6. That is, the geometric discontinuities in the casing 1 are located at a position different from the joint portion where the first and second units 5 and 6 are bonded to each other. Accordingly, it is unlikely to cause a breakage at the joint portion due to the stress concentration at the geometric discontinuities even if the ultrasonic sensor 101 is repeatedly operated. According to the first preferred embodiment, it is thus possible to provide an ultrasonic sensor which is able to increase the sound pressure to be higher and the frequency bandwidth to be wider without significantly reducing the resonant frequency and also to significantly reduce or prevent the occurrence of a breakage caused by the stress concentration at the geometric discontinuities. The simulation results validating the advantages will be discussed later.

In the ultrasonic sensor according to the first preferred embodiment, the stress applied to the bonding surface between different materials of the two units of the casing is able to be decreased. The ultrasonic sensor is able to thus significantly reduce or prevent the occurrence of failures caused by the stress applied to the bonding surface.

The metal of the first unit 5 may preferably be aluminum, for example. Aluminum may also be used in the preferred embodiments described below.

In the first preferred embodiment, the terminals 8 have a tubular or substantially tubular shape. However, this is only an example, and terminals may have another shape. The terminals may not necessarily stand straight. The terminals may be a metal film extending along the surface of the first unit 5. The terminals may be flexible wiring. These modifications of the terminals may also be made in the preferred embodiments described below.

Second Preferred Embodiment

Figure 6:
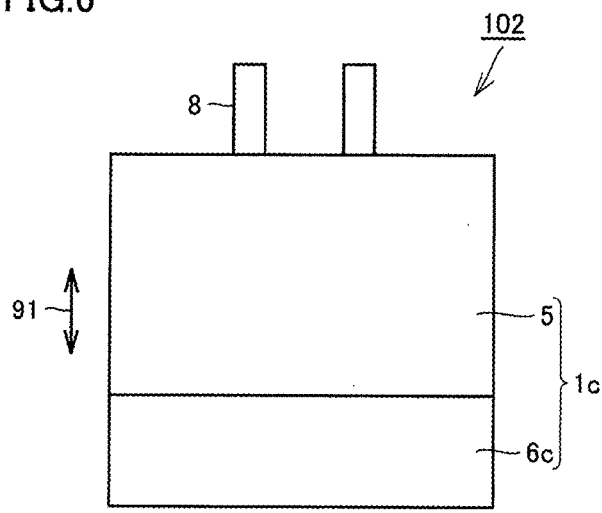
FIG. 6 is a side view of an ultrasonic sensor according to a second preferred embodiment of the present invention.
Figure 7:
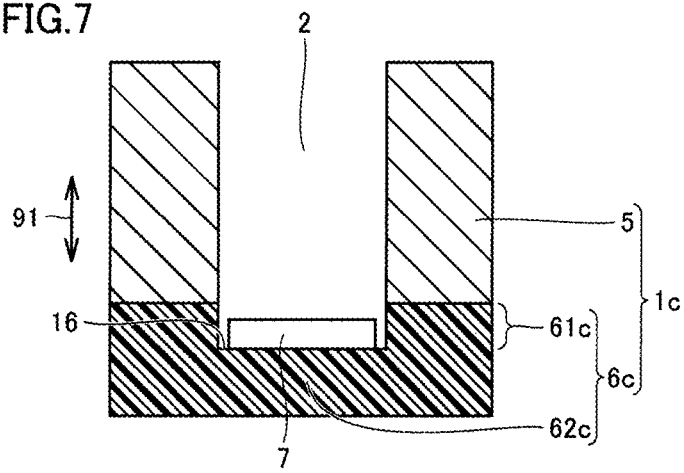
FIG. 7 is a sectional view showing a casing and a piezoelectric vibrator element of the ultrasonic sensor according to the second preferred embodiment of the present invention.

An ultrasonic sensor according to a second preferred embodiment of the present invention will be described below with reference to FIGS. 6 and 7. A side view of an ultrasonic sensor 102 according to the second preferred embodiment is shown in FIG. 6. The ultrasonic sensor 102 includes a casing 1c having a cylindrical or substantially cylindrical shape with a closed bottom and two terminals 8 protruding from the casing 1c. A sectional view showing the casing 1c and a piezoelectric vibrator element 7 is shown in FIG. 7. The ultrasonic sensor 102 includes the piezoelectric vibrator element 7. The casing 1c includes a hollow portion 2. The casing 1c includes a first unit 5 and a second unit 6c. The first unit 5 and the second unit 6c are bonded to each other.

The first unit 5 is preferably made of a metal, for example, aluminum, and has a cylindrical or substantially cylindrical shape extending in a first direction 91. The second unit 6c is preferably made of CFRP (carbon fiber reinforced plastic), for example, and is connected to one end of the first unit 5 in the first direction 91. The second unit 6c includes a cylindrical section 61c and a bottom plate 62c. The cylindrical section 61c is connected to one end of the first unit 5 in the first direction 91 and has a cylindrical or substantially cylindrical shape extending in the first direction 91. The bottom plate 62c is a disk-shaped portion which closes the end of the cylindrical section 61c positioned farther away from the first unit 5 in the first direction 91. The piezoelectric vibrator element 7 is mounted on the second unit 6c, and more specifically, on a surface 16 of the bottom plate 62c positioned closer to the first unit 5. The second unit 6c is integrally made with the CFRP. The matrix of the CFRP is preferably, for example, a resin having excellent heat resistance and chemical resistance and which also has a high mechanical strength, such as polyethersulfone, polyphenylene sulfide, and polynonamethylene terephthalamide. The carbon fiber in the CFRP may be either one of continuous fiber and discontinuous fiber. The CFRP included in the second unit $6c$ including the bottom plate $62c$ preferably has a high elastic modulus. In the second preferred embodiment, the second unit $6c$ includes CFRP preferably having an elastic modulus of about 20 GPa or higher, for example. Accordingly, the casing $1c$ includes the first unit 5 and the second unit $6c$ which are made of different materials.

The configurations of the other elements are the same as or similar to those of the first preferred embodiment.

In the second preferred embodiment, advantages similar to those of the first preferred embodiment are able to be obtained. To maintain the resonant frequency, a material having a high elastic modulus is preferably used, for example, for a portion which is displaced by a considerable amount by vibration. In the second preferred embodiment, the bottom plate $62c$ of the second unit $6c$, which is a portion displaced by a considerable amount by vibration, may preferably be made of CFRP, which is a material having a high elastic modulus.

Third Preferred Embodiment

Figure 8:
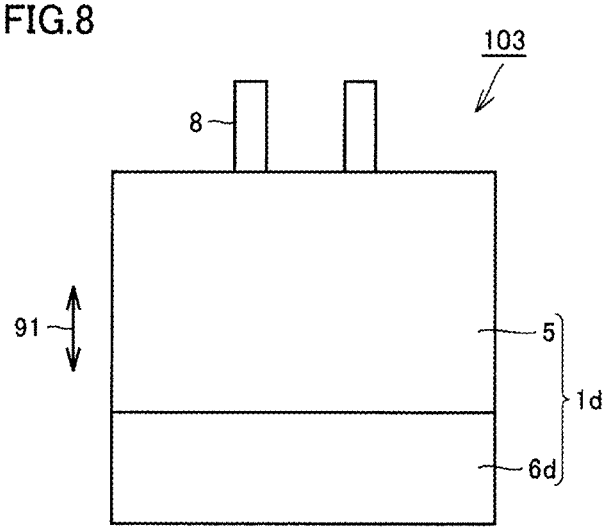
FIG. 8 is a side view of an ultrasonic sensor according to a third preferred embodiment of the present invention.
Figure 9:
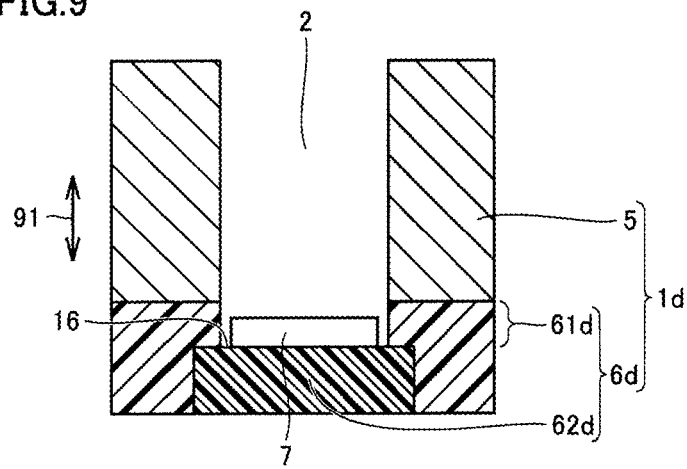
FIG. 9 is a sectional view showing a casing and a piezoelectric vibrator element of the ultrasonic sensor according to the third preferred embodiment of the present invention.
Figure 10:
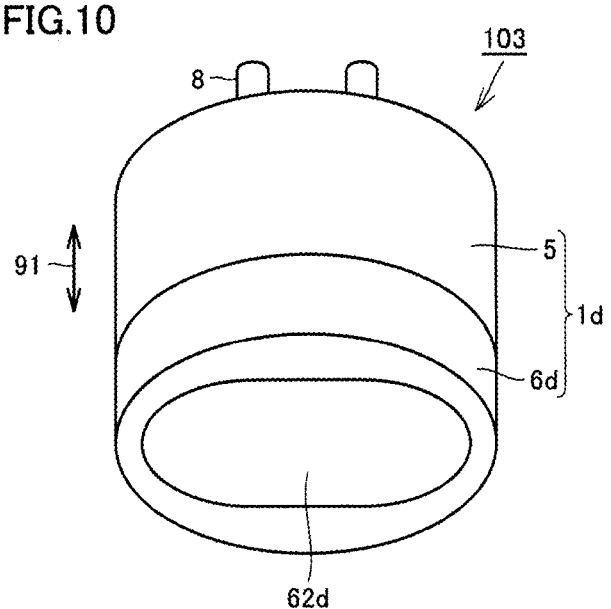
FIG. 10 is a perspective view showing the ultrasonic sensor according to the third preferred embodiment shown in FIG. 8 to make the bottom surface viewable.

An ultrasonic sensor according to a third preferred embodiment of the present invention will be described below with reference to FIGS. 8 through 10. A side view of an ultrasonic sensor 103 according to the third preferred embodiment is shown in FIG. 8. The ultrasonic sensor 103 includes a casing $1d$ having a cylindrical or substantially cylindrical shape with a closed bottom and two terminals 8 protruding from the casing $1d$. A sectional view showing the casing $1d$ and a piezoelectric vibrator element 7 is shown in FIG. 9. The ultrasonic sensor 103 includes the piezoelectric vibrator element 7. The casing $1d$ includes a hollow portion 2. The casing $1d$ includes a first unit 5 and a second unit $6d$. The first unit 5 and the second unit $6d$ are bonded to each other.

The first unit 5 is preferably made of a metal, for example, aluminum, and has a cylindrical or substantially cylindrical shape extending in a first direction 91. The second unit $6d$ is connected to one end of the first unit 5 in the first direction 91. The second unit $6d$ includes a cylindrical section $61d$ and a bottom plate $62d$. The cylindrical section $61d$ is connected to one end of the first unit 5 in the first direction 91 and has a cylindrical or substantially cylindrical shape extending in the first direction 91. The bottom plate $62d$ is a disk-shaped portion which closes the end of the cylindrical section $61d$ positioned farther away from the first unit 5 in the first direction 91. The bottom plate $62d$ is preferably made of CFRP and a resin different from CFRP, for example. More specifically, a portion of the bottom plate $62d$ on which the piezoelectric vibrator element 7 is mounted is preferably made of CFRP, while the other portion of the bottom plate $62d$ is preferably made of a resin different from CFRP. The cylindrical section $61d$ is made of a resin different from CFRP. The matrix of the CFRP is preferably, for example, a resin having excellent heat resistance and chemical resistance and which also has a high mechanical strength, such as polyethersulfone, polyphenylene sulfide, and polynonamethylene terephthalamide. The carbon fiber in the CFRP may be either one of continuous fiber and discontinuous fiber. The CFRP used in the portion of the bottom plate $62d$ on which the piezoelectric vibrator element 7 is mounted preferably has a high elastic modulus. In the third preferred embodiment, the portion of the bottom plate $62d$ on which the piezoelectric vibrator element 7 is mounted is preferably made of CFRP having an elastic modulus of about 20 GPa or higher, for example. "A resin different from CFRP" forming a portion of the bottom plate $62d$ and the cylindrical section $61d$ is preferably, for example, a resin having excellent heat resistance and chemical resistance and which also has a high mechanical strength, such as polyethersulfone, polyphenylene sulfide, and polynonamethylene terephthalamide. Accordingly, the casing $1d$ includes the first unit 5 and the second unit $6d$ which are made of different materials. The piezoelectric vibrator element 7 is mounted on the second unit $6d$, and more specifically, on a surface 16 of the bottom plate $62d$ positioned closer to the first unit 5. A perspective view showing the ultrasonic sensor 103 in FIG. 8 to make the bottom surface, that is, the surface that sends and receives ultrasonic waves, viewable, is shown in FIG. 10. In FIG. 10, the boundary between the portion of the second unit $6d$ made of a resin and the other portion including CFRP can be seen.

The configurations of the other elements are the same as or similar to those of the first preferred embodiment.

In the third preferred embodiment, advantages similar to those of the first preferred embodiment are able to be provided. To maintain the resonant frequency, a material having a high elastic modulus is preferably used, for example, for a portion to be subjected to a high stress by vibration. In the third preferred embodiment, "the portion of the bottom plate $62d$ of the second unit $6d$ on which the piezoelectric vibrator element 7 is mounted", which is a portion displaced by a considerable amount by vibration, is preferably made of CFRP, which is a material having a high elastic modulus. CFRP is relatively an expensive material, while a resin is less expensive. In the third preferred embodiment, in the second unit $6d$, CFRP is used only for a portion of the bottom plate $62d$, and thus a cost is able to be significantly reduced.

The bottom plate $62d$ and the portion including the cylindrical section $61d$ are preferably welded to each other, for example. The portion including the cylindrical section $61d$ is preferably a portion made a resin. The portion of the bottom plate $62d$ is preferably made of CFRP, which also includes resin components. "The portion including the cylindrical section $61d$" is a portion of the bottom plate $62d$ other than the portion of the bottom plate $62d$ on which the piezoelectric vibrator element 7 is mounted. If the portion including the cylindrical section $61d$ and the bottom plate $62d$ are welded to each other, they are able to be firmly bonded to each other, thus significantly improving the reliability of the casing $1d$. This further leads to improving the reliability of the ultrasonic sensor 103.

Fourth Preferred Embodiment

Figure 11:
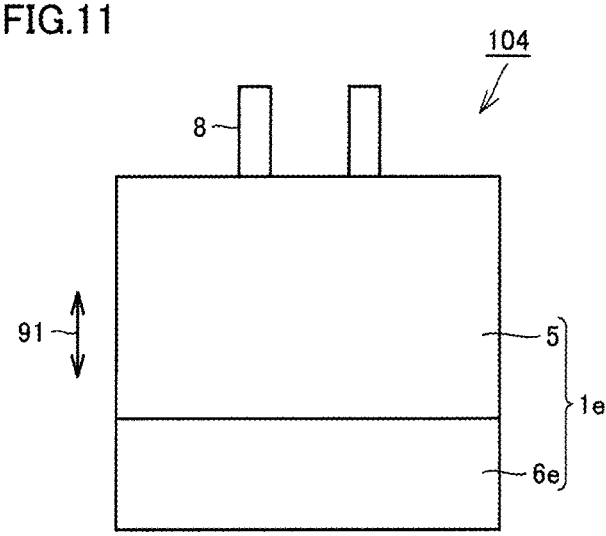
FIG. 11 is a side view of an ultrasonic sensor according to a fourth preferred embodiment of the present invention.
Figure 12:
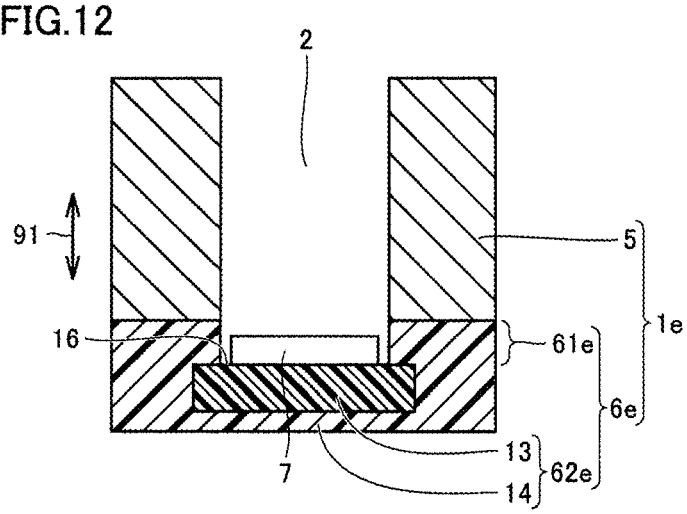
FIG. 12 is a sectional view showing a casing and a piezoelectric vibrator element of the ultrasonic sensor according to the fourth preferred embodiment of the present invention.

An ultrasonic sensor according to a fourth preferred embodiment of the present invention will be described below with reference to FIGS. 11 and 12. A side view of an ultrasonic sensor 104 according to the fourth preferred embodiment is shown in FIG. 11. The ultrasonic sensor 104 includes a casing $1e$ having a cylindrical or substantially cylindrical shape with a closed bottom and two terminals 8 protruding from the casing $1e$. A sectional view showing the casing $1e$ and a piezoelectric vibrator element 7 is shown in FIG. 12. The ultrasonic sensor 104 includes the piezoelectric vibrator element 7. The casing $1e$ has a hollow portion 2. The casing $1e$ includes a first unit 5 and a second unit $6e$. The first unit 5 and the second unit $6e$ are bonded to each other.

The first unit 5 is preferably made of a metal, for example, aluminum, and has a cylindrical or substantially cylindrical shape extending in a first direction 91. The second unit 6e is connected to one end of the first unit 5 in the first direction 91. The second unit 6e includes a cylindrical section 61e and a bottom plate 62e. The cylindrical section 61e is connected to one end of the first unit 5 in the first direction 91 and has a cylindrical or substantially cylindrical shape extending in the first direction 91. The bottom plate 62e is a disk-shaped portion which closes the end of the cylindrical section 61e positioned farther away from the first unit 5 in the first direction 91. The piezoelectric vibrator element 7 is mounted on the second unit 6e, and more specifically, on a surface 16 of the bottom plate 62e positioned closer to the first unit 5. The bottom plate 62e includes a bottom-plate first layer 13 and a bottom-plate second layer 14. The bottom-plate first layer 13 is positioned at the side of the bottom plate 62e closer to the first unit 5 in the first direction 91. The bottom-plate first layer 13 is preferably made of CFRP, for example. The bottom-plate second layer 14 is positioned at the side of the bottom plate 62e farther away from the first unit 5 in the first direction 91 and is superposed on the bottom-plate first layer 13. The bottom-plate second layer 14 is preferably made of a resin different from CFRP. Accordingly, the bottom plate 62e is preferably made CFRP and a resin different from CFRP, for example. More specifically, the bottom-plate first layer 13 of the bottom plate 62e on which the piezoelectric vibrator element 7 is mounted is preferably made of CFRP, while the bottom-plate second layer 14 of the bottom plate 62e is made of a resin different from CFRP. The cylindrical section 61e is preferably made of the same or substantially the same resin as the bottom-plate second layer 14. The matrix of the CFRP is preferably, for example, a resin having heat resistance and chemical resistance and which also has a high mechanical strength, such as polyethersulfone, polyphenylene sulfide, and polynonamethylene terephthalamide. The carbon fiber in the CFRP may be either one of continuous fiber and discontinuous fiber. The CFRP included in the bottom-plate first layer 13 preferably has a high elastic modulus. In the fourth preferred embodiment, the bottom-plate first layer 13 is preferably made of CFRP having an elastic modulus of about 20 GPa or higher, for example. "A resin different from CFRP" used for the bottom-plate second layer 14 and the cylindrical section 61e is preferably, for example, a resin having excellent heat resistance and chemical resistance and which also has a high mechanical strength, such as polyethersulfone, polyphenylene sulfide, and polynonamethylene terephthalamide. Accordingly, the casing 1e includes the first unit 5 and the second unit 6e which include different materials.

The configurations of the other elements are the same as or similar to those of the first preferred embodiment.

In the fourth preferred embodiment, advantages similar to those of the first preferred embodiment are able to be provided. In the fourth preferred embodiment, the outer surfaces of the casing 1e are made of a resin different from CFRP and thus have a highly aesthetic appearance. The surface of the ultrasonic sensor 104 that sends and receives ultrasonic waves is only made of a resin different from CFRP, and is thus easy to paint.

As discussed in the fourth preferred embodiment, the bottom-plate second layer 14 and the cylindrical section 61e are preferably provided integrally. This does not necessarily mean that the bottom-plate second layer 14 and the cylindrical section 61e directly contact each other. Another element may be interposed between the bottom-plate second layer 14 and the cylindrical section 61e. By integrally providing the bottom-plate second layer 14 and the cylindrical section 61e, the surface that sends and receives ultrasonic waves is able to be free from joint portions between different elements, thus maintaining a highly aesthetic appearance.

Figure 13:
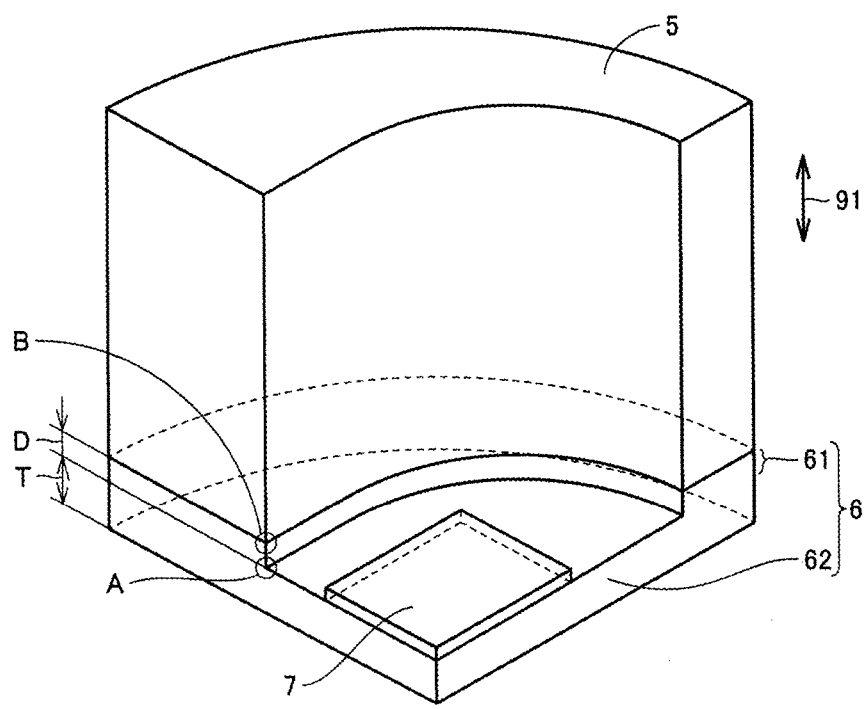
FIG. 13 shows a ¼ model used in the simulations.
Figure 14:
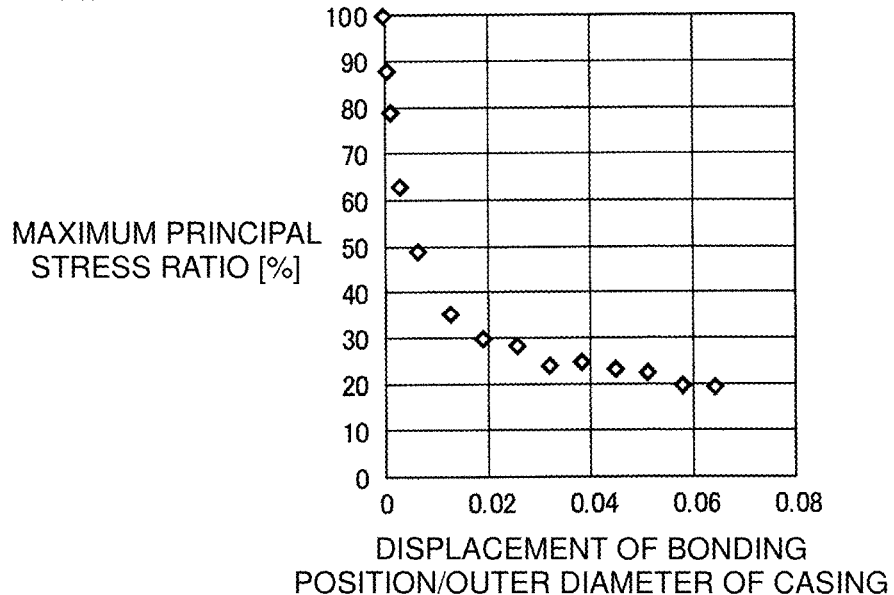
FIG. 14 is a first graph showing the simulation results.
Figure 15:
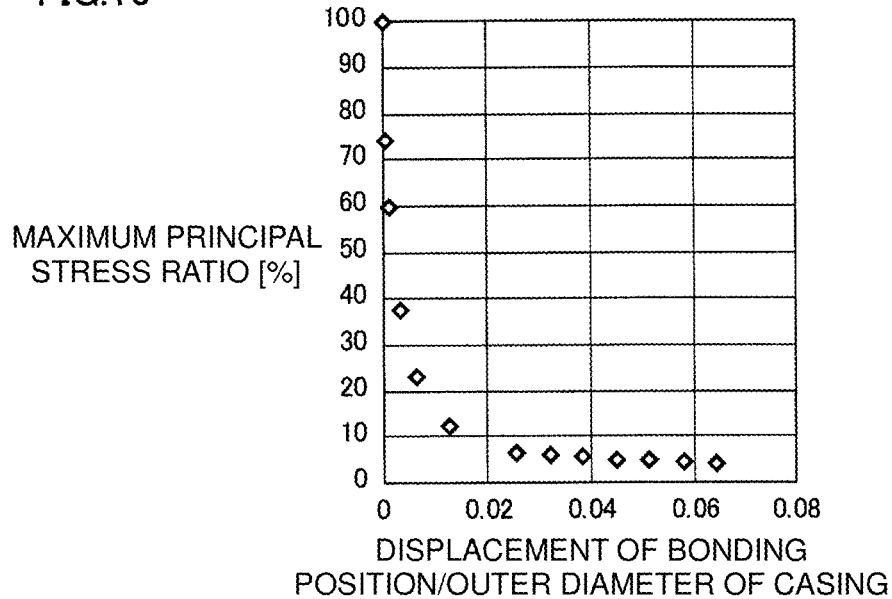
FIG. 15 is a second graph showing the simulation results.
Figure 16:
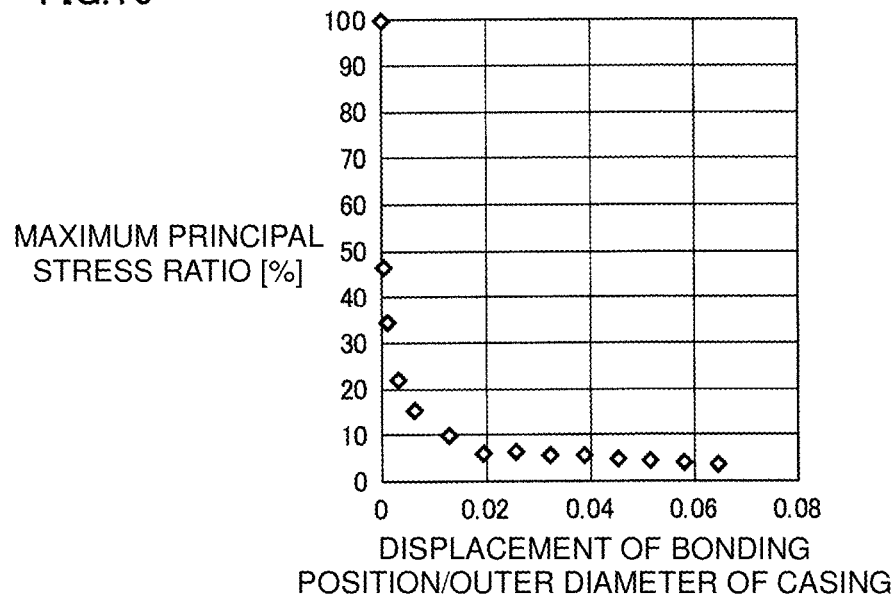
FIG. 16 is a third graph showing the simulation results.

As shown in FIG. 13, a ¼ portion of a combination of a casing and the piezoelectric vibrator element 7 is extracted and is assumed as a model. For the sake of description, the ultrasonic sensor 101 of the first preferred embodiment will be discussed by way of example while referring to the reference numerals used in the first preferred embodiment. The first unit 5 is made of aluminum. The outer diameter of the casing 1 is about 15.5 mm. The thickness T of the bottom plate 62 is about 1.0 mm. When the bottom plate 62 vibrates in response to the sending or receiving of ultrasonic waves, a stress is applied mainly to a point A. The maximum principal stress at a point B, which is the innermost point at the interface between the first unit 5 and the second unit 6, is found by simulations. The displacement amount of the point B from the point A is indicated by D. The simulation results obtained from this model are shown in FIGS. 14 through 16. FIG. 14 shows the simulation results concerning the ultrasonic sensor 101. "Displacement of bonding position" on the horizontal axis represents the displacement amount D. "Outer diameter of casing" represents the outer diameter of the casing 1. In FIG. 14, the maximum principal stress is assumed as 100% when D=0, and the maximum principal stress ratio, that is, the maximum principal stress represented by percentage, is taken on the vertical axis. As shown in FIG. 14, increasing the displacement D of the bonding position is able to significantly reduce the maximum principal stress ratio at the point B.

Regarding the ultrasonic sensor 102 of the second preferred embodiment, a portion of the ultrasonic sensor 102 is similarly assumed as a model. FIG. 15 shows the simulation results concerning the ultrasonic sensor 102. Regarding the ultrasonic sensor 103 of the third preferred embodiment, a portion of the ultrasonic sensor 103 is similarly assumed as a model. FIG. 16 shows the simulation results concerning the ultrasonic sensor 103. Regarding these models, increasing the displacement D of the bonding position is able to significantly reduce the maximum principal stress ratio at the point B, as shown in FIGS. 15 and 16.

Figure 17:
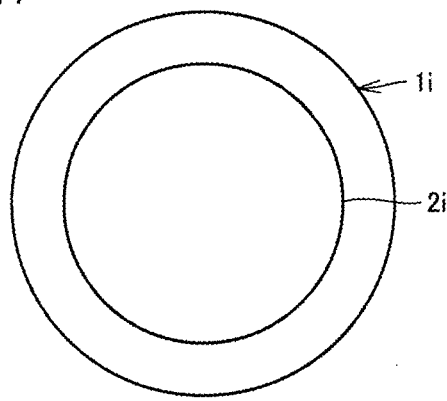
FIG. 17 is a plan view showing a first example of the shape of a hollow portion provided in the casing.

Variations of the shape of the hollow portion provided in the casing will be discussed. In FIG. 2, as the shape of the hollow portion 2 as viewed from above, a combination of two parallel straight lines and two semicircles is shown by way of example, and substantially straight lines and substantially semicircular shapes may be included. However, the hollow portion as viewed from above is not limited to this shape and may have another shape. For example, a casing 1i shown in FIG. 17 includes a hollow portion 2i. The shape of the hollow portion 2i is a circle or substantially a circle as viewed from above. The shape of the hollow portion 2i is concentric with respect to the outer shape of the casing 1i. The casing of the ultrasonic sensor may be provided as described above.

Figure 18:
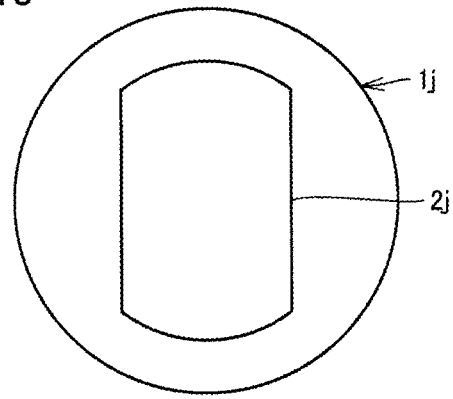
FIG. 18 is a plan view showing a second example of the shape of a hollow portion provided in the casing.

A casing 1j shown in FIG. 18 includes a hollow portion 2j. The hollow portion 2j has a shape of a combination of two straight lines and two arcs as viewed from above. The arcs are concentric with respect to the outer shape of the casing 1j. The casing of the ultrasonic sensor may be provided as described above.

Figure 19:
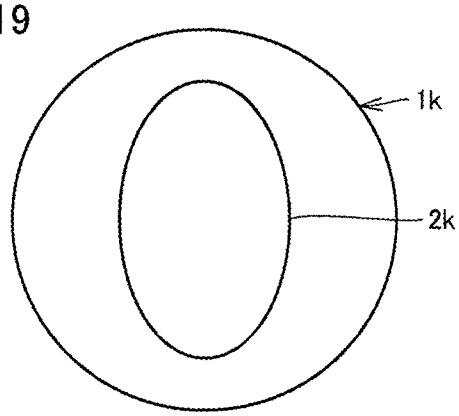
FIG. 19 is a plan view showing a third example of the shape of a hollow portion provided in the casing.

A casing 1k shown in FIG. 19 includes a hollow portion 2k. The shape of the hollow portion 2k is an ellipse or substantially an ellipse as viewed from above. The casing of the ultrasonic sensor may be provided as described above.

Some examples of the shape of the hollow portion have been described above. However, the shape of the hollow portion as viewed from above is not limited to these examples and may be another shape. Regarding the casing, the shape of the casing as viewed from above is not restricted to a circle and may be another shape.

Among the above-described preferred embodiments, some preferred embodiments may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ultrasonic sensor comprising:
   a casing; and
   a piezoelectric vibrator element; wherein
   the casing includes first and second units, the first unit being made of a metal, the second unit being made of a resin;
   the first unit has a cylindrical or substantially cylindrical shape extending in a first direction;
   the second unit is connected to one end of the first unit in the first direction and includes a cylindrical section and a bottom plate, the cylindrical section having a cylindrical or substantially cylindrical shape and extending in the first direction, the bottom plate being a disk-shaped portion which closes an end of the cylindrical section positioned farther away from the first unit in the first direction, the piezoelectric vibrator element being mounted on the bottom plate; and
   the bottom plate is made of carbon fiber reinforced plastic (CFRP), and the cylindrical section is made of a resin different from CFRP.

2. The ultrasonic sensor according to claim 1, wherein the bottom plate and a portion including the cylindrical section are welded to each other.

3. The ultrasonic sensor according to claim 1, further comprising:
   at least one terminal that is at least partially located on an exterior of the casing; wherein
   the at least one terminal is electrically connected to the piezoelectric vibrator element.

4. The ultrasonic sensor according to claim 3, wherein the at least one terminal protrudes from the casing.

5. The ultrasonic sensor according to claim 3, wherein the at least one terminal is a metal film provided on a surface of the first unit.

6. The ultrasonic sensor according to claim 1, wherein first unit and the second unit define a hollow portion of the casing.

7. The ultrasonic sensor according to claim 6, wherein the hollow portion includes a filler that seals the piezoelectric vibrator element.

8. The ultrasonic sensor according to claim 1, wherein the metal of the first unit includes aluminum.

9. The ultrasonic sensor according to claim 1, wherein a portion of the bottom plate on which the piezoelectric vibrator element is mounted is a resin with an elastic modulus of about 20 GPa or higher.

10. An ultrasonic sensor comprising:
    a casing; and
    a piezoelectric vibrator element; wherein
    the casing includes first and second units, the first unit being made of a metal, the second unit being made of a resin;
    the first unit has a cylindrical or substantially cylindrical shape extending in a first direction;
    the second unit is connected to one end of the first unit in the first direction and includes a cylindrical section and a bottom plate, the cylindrical section having a cylindrical or substantially cylindrical shape and extending in the first direction, the bottom plate being a disk-shaped portion which closes an end of the cylindrical section positioned farther away from the first unit in the first direction, the piezoelectric vibrator element being mounted on the bottom plate;
    the bottom plate includes a bottom-plate first layer and a bottom-plate second layer;
    the bottom-plate first layer is made of carbon fiber reinforced plastic (CFRP) and is positioned at a side of the bottom plate closer to the first unit in the first direction; and
    the bottom-plate second layer is made of a resin different from CFRP and is positioned at a side of the bottom plate farther away from the first unit in the first direction.

11. The ultrasonic sensor according to claim 10, wherein the bottom-plate second layer and the cylindrical section are integrally provided.

12. The ultrasonic sensor according to claim 10, further comprising:
    at least one terminal that is at least partially located on an exterior of the casing; wherein
    the at least one terminal is electrically connected to the piezoelectric vibrator element.

13. The ultrasonic sensor according to claim 12, wherein the at least one terminal protrudes from the casing.

14. The ultrasonic sensor according to claim 12, wherein the at least one terminal is a metal film provided on a surface of the first unit.

15. The ultrasonic sensor according to claim 10, wherein the first unit and the second unit define a hollow portion of the casing.

16. The ultrasonic sensor according to claim 15, wherein the hollow portion includes a filler that seals the piezoelectric vibrator element.

17. The ultrasonic sensor according to claim 10, wherein the metal of the first unit includes aluminum.

18. The ultrasonic sensor according to claim 10, wherein a portion of the bottom plate on which the piezoelectric vibrator element is mounted is a resin with an elastic modulus of about 20 GPa or higher.

* * * * *